United States Patent [19]

Tsukamoto

[11] Patent Number: 5,781,376
[45] Date of Patent: Jul. 14, 1998

[54] MAGNETIC HEAD WITH POLYCRYSTALLINE SILICON LAYER ON SLIDE RUNNING SURFACE

[75] Inventor: Yuji Tsukamoto, Tokyo, Japan

[73] Assignee: NEC Corporation, Tokyo, Japan

[21] Appl. No.: 580,820

[22] Filed: Dec. 29, 1995

[30] Foreign Application Priority Data

Jan. 5, 1995 [JP] Japan ................................. 7-000301

[51] Int. Cl.$^6$ ................................................... G11B 5/60
[52] U.S. Cl. ........................................................ 360/103
[58] Field of Search ................................... 360/102–103

[56] References Cited

U.S. PATENT DOCUMENTS

| | | | |
|---|---|---|---|
| 5,010,429 | 4/1991 | Taguchi et al. | 360/103 |
| 5,305,165 | 4/1994 | Brezoczky et al. | 360/103 |
| 5,323,282 | 6/1994 | Kanai et al. | 360/103 |
| 5,535,073 | 7/1996 | Brezoczky et al. | 360/103 |
| 5,579,199 | 11/1996 | Kawamura et al. | 365/108 |
| 5,670,253 | 9/1997 | Chiu et al. | 428/336 |

FOREIGN PATENT DOCUMENTS

63-28912A   5/1987   Japan .

*Primary Examiner*—John H. Wolff
*Attorney, Agent, or Firm*—Laff, Whitesel, Conte & Saret, Ltd.

[57] ABSTRACT

The magnetic head disclosed has a slider which comprises a running surface where contact-sliding with respect to a magnetic recording medium occurs, and a polycrystalline silicon film which is provided on at least a portion of said running surface. The polycrystalline silicon film has a thickness of 3 to 10 nm. The running surface is formed of $Al_2O_3$.TiC ceramic or silicon. This arrangement is effective in preventing an attraction phenomenon between the head and medium, reducing a frictional coefficient and suppressing damage to the medium.

6 Claims, 5 Drawing Sheets

MAGNETIC HEAD WITH POLYCRYSTALLINE SILICON LAYER ON SLIDE RUNNING SURFACE

BACKGROUND OF THE INVENTION (1) Field of the Invention

The present invention relates to magnetic heads for use in magnetic storage devices, and more particularly to magnetic heads which excel in mechanical durability.

(2) Description of the Related Art

Recent recording density improvement in magnetic storage devices is remarkable, and many technical innovations are being made to attain an annual recording density improvement reaching 200%. Particularly pronounced is the technical advancement for reducing the distance between a magnetic head and a magnetic recording medium to improve the line recording density. Currently, hard disk drives with head-medium distances of 100 nm and less and head floating extents of 50 nm are in use. In order to reduce the head-medium distance and floating extent of the head, the following is adopted.

1) Adoption of low floating magnetic heads,

2) Smoothing of the magnetic recording medium surface and the magnetic head running surface, 3) Thickness reduction of the protective film of the magnetic recording medium, and 4) Thickness increase of the lubricant film of the magnetic recording medium.

While these measures have contributed to the line recording density improvement through the reduction of the head-medium distance and floating extent of head, there have been negative effects on the reliability and mechanical durability of magnetic disk drive as explained below.

For example, the lowering of the floating height of the head increases the probability of contact-sliding of the head with respect to the magnetic recording medium rotating at high speed during the operation of magnetic disk drive, thus reducing the reliability and mechanical durability of the magnetic disk drive.

The smoothing of the medium surface in 2) above promotes the phenomenon of attraction between the head and the medium via a lubricant film of the medium. A strong attracting force (corresponding to a static frictional force) acting between the head and the medium may result in a state wherein the magnetic disk cannot be started with the disk drive motor torque at the start of the disk. In order to hold the static frictional force between the head and the medium within a permissible value, it is necessary to provide a predetermined level of surface roughness to both the medium and the head. In practice, the usual magnetic recording medium is formed with a controlled surface roughness shape called "texture". This surface roughness is a factor of increasing the probability of high speed contact-sliding between the head and the medium explained above.

The magnetic recording medium protective film, when its thickness is reduced, loses its wear resistance, thus causing reduction of its reliability and life. The thickness increase of the lubricant film in 4) above is a measure for suppressing the wear resistance deterioration caused by the thickness reduction of protective film. This measure, however, accelerates the phenomenon of attraction between the head and the medium, thus imposing restriction on the thickness of the lubricant film formed on the medium. It is thought that provision of a lubricant film with a thickness in excess of 5 nm is dangerous. Thus, there is a limit in the reliance on the lubricant film to suppress the mechanical damage on the medium surface.

In view of the above, in order to reduce the head-medium distance and floating extent of the head and ensure reliability of the apparatus, it is considered necessary to prevent damage to the medium by the head. From this consideration, it has been proposed to provide a protective film on the running surface of the magnetic head.

As an example, Japanese Patent Application Kokai Publication No. Sho 63-282912 shows provision of a graphite fluoride layer on the running surface of a glassy carbon magnetic head slider by fluorination. According to the report, the provision of graphite fluoride having satisfactory solid lubricant characteristics on the slider running surface, permits restricting wear damage to the magnetic recording medium and preventing start failure or stick slip phenomenon caused by the attraction between the head and the medium. With a similar idea, magnetic heads having a carbon film formed by the CVD (Chemical Vapor Deposition) process or the sputtering process, are in use.

The above magnetic head protective film (hereinafter referred to as head protective film) has the following problems. The latter carbon protective film is usually formed on the slider running surface of alumina/titanium carbide mixture ceramic ($Al_2O_3$.TiC). However, since the adhesivity between carbon/$Al_2O_3$.TiC is rather unsatisfactory, silicon is provided as an adhesion improvement layer. This silicon layer naturally leads to a corresponding increase of the head-medium distance. In addition, the carbon protective film has low frictional coefficient under high speed contact-sliding conditions, and it obviously has an effect of reducing wear damage to the medium. However, its frictional coefficient in a low speed region and also in the stationary state, i.e., at zero relative speed, is high compared to the magnetic head without any carbon protective film. For this reason, it has been pointed out that there is a high probability for the attraction phenomenon between the head and the medium to be a cause for start troubles of magnetic disk drive.

A further problem is that the graphite fluoride layer provision technique, i.e., providing fluorination on the running surface of glassy carbon magnetic head slider, is applicable to glassy carbon only and not applicable to other slider materials, for instance, $Al_2O_3$.TiC.

SUMMARY OF THE INVENTION

An object of the invention is to provide a magnetic head which has a polycrystalline silicon layer on at least a portion of its running surface where contact-sliding occurs with a magnetic recording medium and in which the durability and medium damage prevention properties are improved, thereby ensuring the reliability and life of the magnetic disk drive which uses such a magnetic head of a low floating type.

According to one aspect of the invention, there is provided a magnetic head having a slider, the slider comprising:

a running surface at which contact-sliding with respect to a magnetic recording medium occurs; and a polycrystalline silicon film which is provided on at least a portion of the running surface.

The polycrystalline silicon layer provided on the magnetic head according to the invention has the properties as explained below which solve the technical problems existing in the prior art. Because of these properties, the film has an excellent effect as a protective film on the running surface of the head.

1) The polycrystalline silicon layer excels in adhesivity with respect to many substrates or underlying materials and, since the property is chemically stable, it is not easily affected in long use or even when the film is exposed to a high temperature, a high relative humidity or like stringent environments.

The running surface itself of the head which is intermittently or continuously in contact-sliding with the magnetic disk medium, should be satisfactorily wear-resistant and should have a function of minimizing damage to the medium. For the prevention of the separation and detachment of the layer during the contact-sliding with the medium, satisfactory adhesion is the essential condition. From the standpoint of the long term reliability of the magnetic disk drive, it is an advantageous condition that the adhesion is subject to less changes and that satisfactory adhesion is maintained.

2) The polycrystalline silicon layer has an adequate hardness satisfying both the wear resistance of the layer itself and the medium damage prevention property.

During the contact-sliding, not only the separation damage mentioned above, but also wear damage, i.e., gradual removal of the layer from the surface, is caused. In order to suppress the wear damage, high hardness is desired. Excessively high hardness, however, gives rise to the problem of excessively damaging the medium surface. Accordingly, an adequate hardness satisfying both the conditions is desired. The polycrystalline silicon layer formed on the running surface of the magnetic head has a thickness as thin as several nm, so that its hardness cannot even be measured with the existing hardness testers. However, the hardness of polycrystalline silicon film 0.1 µm thick, obtained under the same conditions (as measured using a thin film hardness tester model "MHA-400" manufactured by NEC) is about 30 GPa (corresponding to a Vicker hardness of about 820) in the average. This value is slightly lower than the hardness of the carbon thin film that is usually used as the protective film of the magnetic disk, i.e., 35 to 40 GPa (corresponding to the Vicker hardness of 930 to 1,030). It is thought that the difference in the hardness fulfills both the conditions of the wear resistance of the polycrystalline silicon layer itself and the property of medium damage prevention.

3) The layer has fine surface undulations stemming from its crystallinity, and these undulations can be relatively easily controlled.

As described before, the medium surface is roughened by producing the texture roughness in order to prevent the phenomenon of attraction between the head and the medium. If the head surface can be given fine roughness, it permits further suppression of the attraction phenomenon. However, it is difficult with a slider fabrication which requires high dimensional accuracy to form fine surface undulations under control on $Al_2O_3$.TiC ceramics which are used most usually as head slider material. Therefore, the material is used in a very smooth state as will be described later in connection with examples. Fine surface undulations, which are formed by the provision of crystalline silicon on the running surface of the head are effective for preventing the head-medium attraction, i.e., reducing static friction coefficient and dynamic friction coefficient in a low speed range.

4) The polycrystalline silicon film produced by the CVD process is chemically stable in that it contains a large quantity of hydrogen and that many silicon atom distal bonds called dangling bonds are bonded with hydrogen atoms. Polycrystalline silicon which is produced by the eximer laser annealing process can further be imparted with the same properties as the CVD process polycystalline silicon by finally providing a hydrogen plasma process.

The chemical stability of the polycrystalline silicon film is effective not only against the adhesive changes with lapse of time as mentioned above but also for suppressing the attraction or decomposition of lubricant molecules on the magnetic disk medium. The attraction of lubricant molecules increases the friction coefficient in the low speed range. When the head slides over the medium, lubricant molecules undergo pyrolysis to increase the friction coefficient. Moreover, the wetting property with respect to the lubricant is reduced. The attraction thus can be effectively prevented. The polycrystalline silicon film has high chemical stability compared to conventional $Al_2O_3$.TiC ceramic or carbon films, which is effective for reducing the friction coefficient.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Figure 1A:
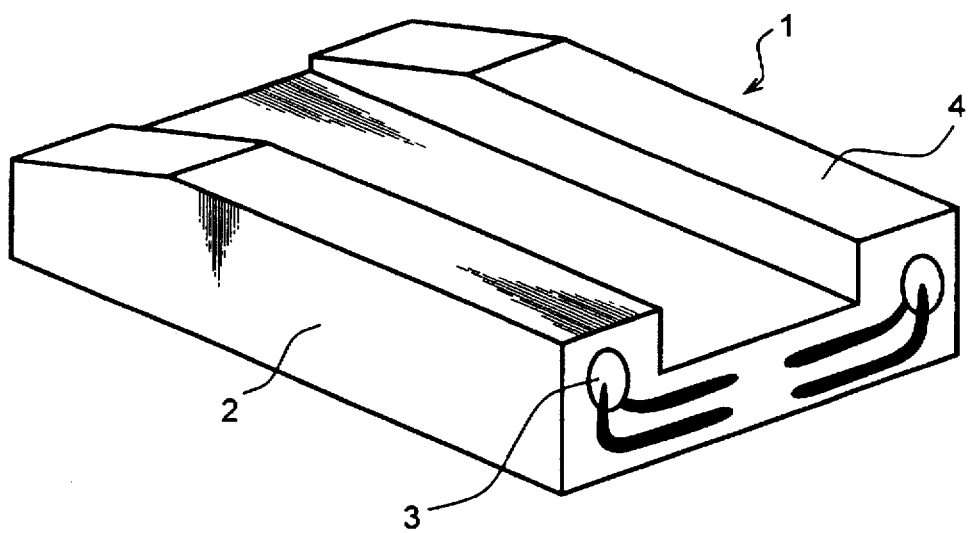
FIG. 1A is a perspective view showing a first embodiment of the magnetic head according to the invention.
Figure 1B:
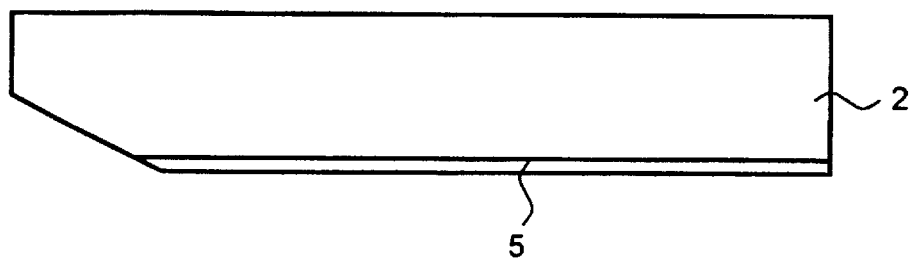
FIG. 1B is a partial sectional view showing the running surface of a slider in the magnetic head.

Now, examples of the invention will be described with reference to the drawings. FIG. 1A shows a magnetic head embodying the invention. This magnetic head 1 is an example of application of the invention to a magnetic head which is commonly called two-rail floating slider. The head comprises a slider 2 for running along a magnetic medium surface and a magnetic transducer 3 for recording, reproducing and erasing operations. FIG. 1B is a sectional view showing a slider rail portion of the magnetic head. A polycrystalline silicon film 5 is provided on the slider running surface 4.

As the slider 2, those made of $Al_2O_3$.TiC ceramic materials are currently extensively used. According to the invention, however, it is possible to use a silicon substrate used for semiconductor and other purposes.

EXAMPLE 1

Using an $Al_2O_3$.TiC ceramic slider, the polycrystalline silicon film 5 was formed to a thickness of 10 nm by the CVD process on the slider running surface 4.

The polycrystalline silicon film was formed under the following conditions of the CVD process. An $Al_2O_3.TiC$ ceramic substrate as slider was heated at 600° C. As the material, a mixed gas of $SiH_4$ and $H_2$ was used. The component gases were introduced at rates of 20 and 18 ml/min., respectively. The reaction was caused by plasma excitation with an input power of 200 W. After the formation of the polycrystalline silicon film on the ceramic substrate, a slider shape having a length of 2 mm, a width of 1.6 mm, and a rail width of 200 μm was obtained by mechanical processing.

EXAMPLES 2 to 4

The same fabrication conditions were set as in Example 1 except for setting the thickness of the polycrystalline silicon film to 8 to 3 nm.

EXAMPLE 5

A polycrystalline silicon film was produced by forming a silicon film by the high frequency sputtering process on $Al_2O_3.TiC$ ceramic and irradiating the silicon film with a laser beam from an eximer laser. As the conditions for forming the silicon film by the sputtering process, a silicon substrate was used for the target, and the input power was set to 400 W. As the discharge gas, a mixed gas of $Ar+20\% H_2$ was used to provide an increased hydrogen concentration in silicon. The gas pressure was set to 1 Pa. The silicon film was polycrystallized by eximer laser beam irradiation. As the conditions of the laser beam irradiation, the laser beam irradiation area was set to 1 mm square, and the laser beam energy was set to 400 $mJ/cm^2$. Under these conditions, the same place was irradiated to the laser beam three times. After the eximer laser beam irradiation, mechanical processing to the shape as described above was carried out, thus obtaining a slider. The thickness of this polycrystalline silicon film was 10 nm.

EXAMPLES 6 to 8

The same fabrication conditions as in Example 3 were set except for setting the polycrystalline silicon film thickness to 8 to 3 nm.

EXAMPLES 9 to 12

A polycrystalline silicon film having a thickness of 10 to 3 nm was formed by the CVD process under the same conditions as in Example 1 by using a silicon substrate as slider material. After the polycrystalline silicon film formation, the same slider shape as in Example 1 was obtained by the dry etching process. Testing was then made.

EXAMPLES 13 to 16

A polycrystalline silicon film having a thickness of 10 to 3 nm was formed by the sputtering and eximer laser processes under the same conditions as in Example 5 by using a silicon substrate as slider material. After the polycrystalline silicon film formation, the same slider shape as in Example 1 was obtained by the dry etching process. Testing was then made.

COMPARATIVE EXAMPLE 1

A silicon film was formed to a thickness of 50 nm on $Al_2O_3.TiC$ ceramic by the high frequency sputtering process, and then a carbon film was formed to a thickness of 5 nm again by the high frequency process. As conditions of the silicon film formation by the sputtering process, a silicon substrate was used as the target, and the input power was set to 400 W. Ar was used as the discharge gas. The gas pressure was set to 1 Pa. As conditions of carbon film by the sputtering process, a carbon substrate was used as the target, and the input power was set to 300 W. Ar was used as the discharge gas, and the gas pressure was set to 1 Pa. After the carbon film formation, the same slider shape as in Example 1 was obtained by mechanical processing. Testing was then made.

COMPARATIVE EXAMPLES 2 to 4

The same conditions as in Comparative Example 1 were set except for setting the thicknesses of the silicon film and carbon film to 2 to 4 nm.

COMPARATIVE EXAMPLE 5

In this instance, an $Al_2O_3.TiC$ slider was used to obtain magnetic head, and no protective film was provided on the slider running surface.

COMPARATIVE EXAMPLE 6

A silicon slider was used to obtain magnetic head. No protective film was provided on the slider running surface.

The processes, slider materials used and polycrystalline silicon film thicknesses in Examples 1 to 16 and Comparative Examples 1 to 6 are collectively shown in TABLE 1.

TABLE 1

| Examples | Slider Materials | Polycrystalline Silicon Formation Methods | Polycrystalline Silicon Film Thicknesses (nm) |
| --- | --- | --- | --- |
| 1 | $Al_2O_3/TiC$ | CVD | 10 |
| 2 | $Al_2O_3.TiC$ | CVD | 8 |
| 3 | $Al_2O_3/TiC$ | CVD | 5 |
| 4 | $Al_2O_3.TiC$ | CVD | 3 |
| 5 | $Al_2O_3/TiC$ | Eximer laser | 10 |
| 6 | $Al_2O_3/TiC$ | Eximer laser | 8 |
| 7 | $Al_2O_3/TiC$ | Eximer laser | 5 |
| 8 | $Al_2O_3/TiC$ | Eximer laser | 3 |
| 9 | Silicon | CVD | 10 |
| 10 | Silicon | CVD | 8 |
| 11 | Silicon | CVD | 5 |
| 12 | Silicon | CVD | 3 |
| 13 | Silicon | Eximer laser | 10 |
| 14 | Silicon | Eximer laser | 8 |
| 15 | Silicon | Eximer laser | 5 |
| 16 | Silicon | Eximer laser | 3 |

| Comparative Examples | Slider Materials | Slider Protective Film Formation Methods | Protective Film Kinds/Thicknesses |
| --- | --- | --- | --- |
| 1 | $Al_2O_3/TiC$ | Sputtering | Si 5 nm/C 5 nm |
| 2 | $Al_2O_3/TiC$ | Sputtering | Si 4 nm/C 4 nm |
| 3 | $Al_2O_3/TiC$ | Sputtering | Si 3 nm/C 3 nm |
| 4 | $Al_2O_3/TiC$ | Sputtering | Si 2 nm/C 2 nm |
| 5 | $Al_2O_3/TiC$ | — | — |
| 6 | Silicon | — | — |

With a total of 22 magnetic disks in Examples 1 to 16 and Comparative Examples 1 to 6, various tests were conducted using the following magnetic disk medium. The magnetic disk medium used was obtained by forming a non-magnetic NiP non-electrolytic plating layer to a thickness of about 20 μm on an aluminum alloy substrate with a diameter of 3.5 inches, and the NiP film was given with the texture roughness by mechanical process. Further, using the sputtering process, on the NiP film, were formed a Cr film 100 nm in thickness as magnetic underlying film, a CoCrTa film 40 nm in thickness as a magnetic film, and a carbon film 20 nm in thickness as a protective film. Finally, the carbon film was covered by a perfluoropolyether type lubricant to a thickness of 20 nm. As the average surface roughness of the magnetic disk medium, the center line average roughness was about 5 nm, and the maximum roughness was about 35 nm.

The attraction property of each magnetic head under a high temperature, high relative humidity environment was compared. Magnetic disk medium in an environment at a temperature of 50° C. and with a relative humidity of 80%, was held pressed by each magnetic head with a load of 4 g, and then the static friction coefficient was measured. In the comparative examples, the static friction coefficient was 0.4 and greater, mostly 0.5 and greater, whereas in the examples according to the invention it was mostly 0.3 and less, and 0.4 and less even with head in which the polycrystalline silicon film was as thin as 3 nm. Obviously, in comparison to the comparative examples, the polycrystalline silicon film according to the invention has satisfactory attraction phenomenon suppression effect.

TABLE 2

| | Static Friction Coefficient |
|---|---|
| Examples | |
| 1 | 0.28 |
| 2 | 0.26 |
| 3 | 0.31 |
| 4 | 0.35 |
| 5 | 0.22 |
| 6 | 0.30 |
| 7 | 0.28 |
| 8 | 0.35 |
| 9 | 0.23 |
| 10 | 0.25 |
| 11 | 0.34 |
| 12 | 0.38 |
| 13 | 0.26 |
| 14 | 0.29 |
| 15 | 0.25 |
| 16 | 0.31 |
| Comparative Examples | |
| 1 | 0.55 |
| 2 | 0.52 |
| 3 | 0.49 |
| 4 | 0.56 |
| 5 | 0.43 |
| 6 | 0.58 |

The speed dependency of the dynamic friction coefficient in low speed range was also measured. The magnetic disk was rotated as speeds of 0 (static friction coefficient mention above) to 2 m/sec., and the frictional force acting on the magnetic head was measured. The dynamic friction coefficient was obtained by dividing the measured frictional force by 4 g. The environment of measurement was at a temperature of 50° C. and under a relative humidity of 80%.

Figure 2:
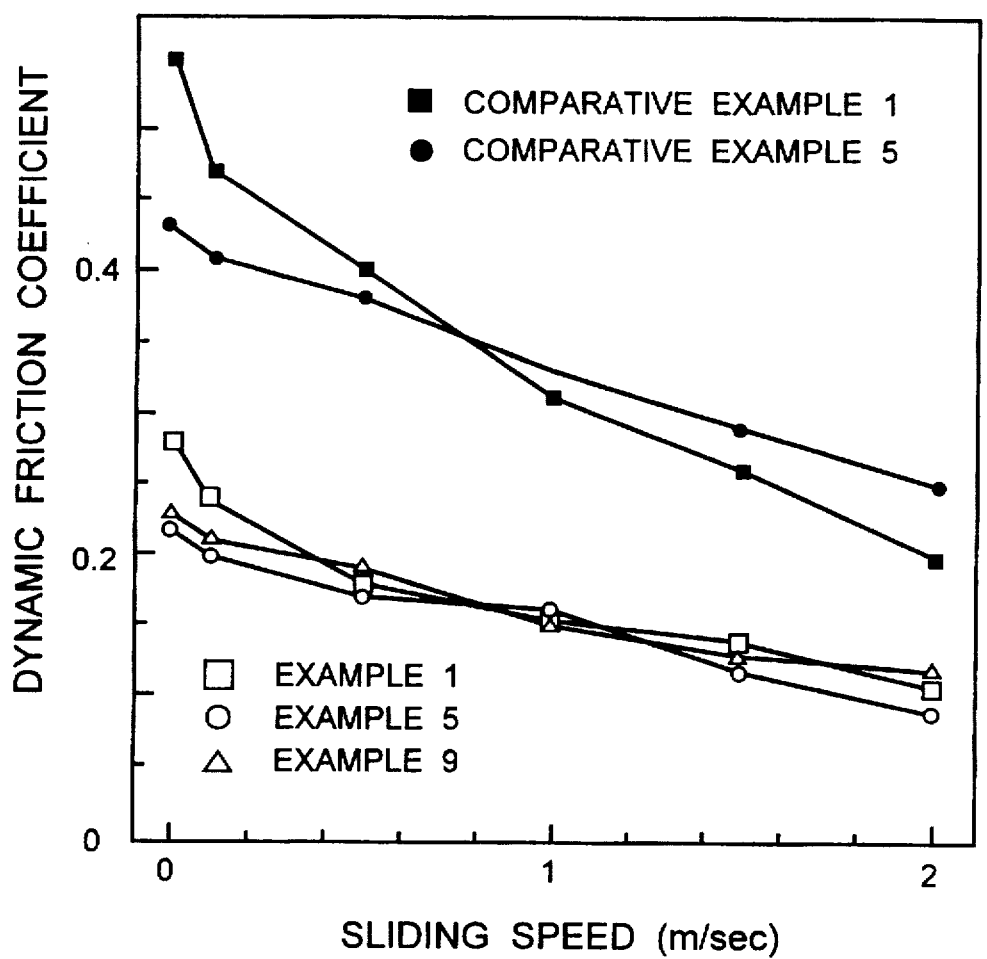
FIG. 2 is a graph showing the results of measurement of speed dependency of dynamic friction coefficient in a low sliding speed range.

FIG. 2 shows results of measurement with five different samples, i.e., Example 1 ($Al_2O_3$.TiC slider, CVD, polycrystalline silicon film thickness: 10 nm), Example 5 ($Al_2O_3$.TiC slider, eximer laser, polycrystalline silicon film thickness: 10 nm), Example 9 (silicon, CVD, polycrystalline silicon film thickness: 10 nm), Comparative Example ($Al_2O_3$.TiC slider, sputtering, Si 5 nm/C 5 nm), and Comparative Example 5 ($Al_2O_3$.TiC slider, no slider running surface protective film). It is obvious that the friction coefficient in the low speed range can be extremely reduced by applying the polycrystalline silicon protective film according to the invention. While FIG. 2 shows the results of measurement in the case of a polycrystalline silicon film thickness of 10 nm, it could also be confirmed that the effect of reducing the dynamic friction coefficient in the low speed range could be confirmed with other examples, i.e., thinner polycrystalline silicon films, as well.

Figure 3:
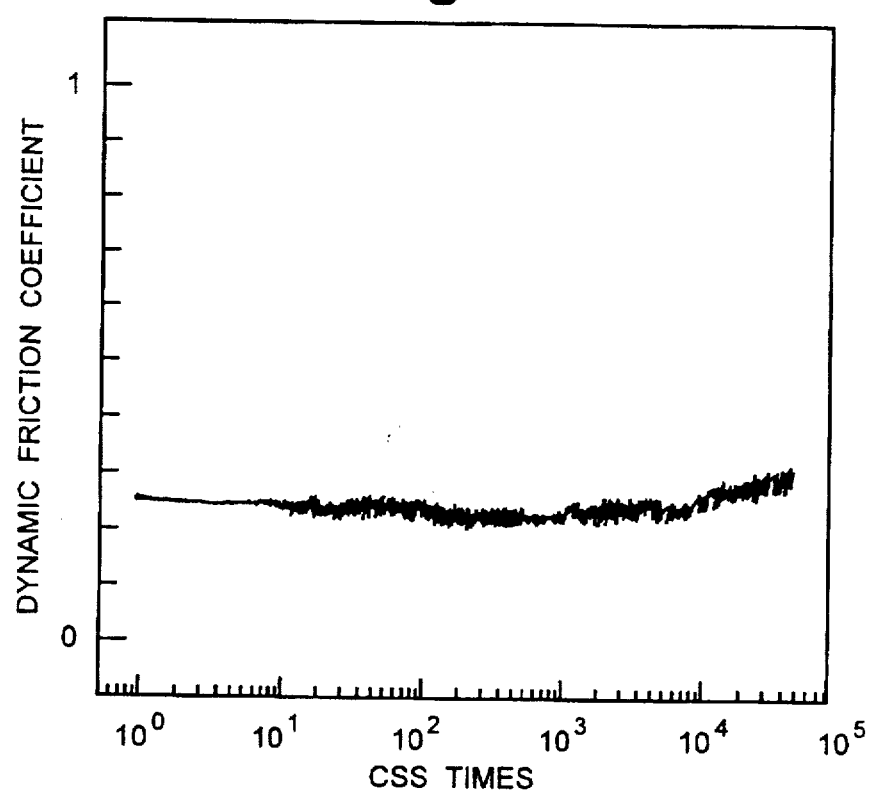
FIG. 3 is a graph showing results of measurement of the maximum friction coefficient plotted against the number of times of CSS (Contact/Start/Stop) test in Example 3.
Figure 4:
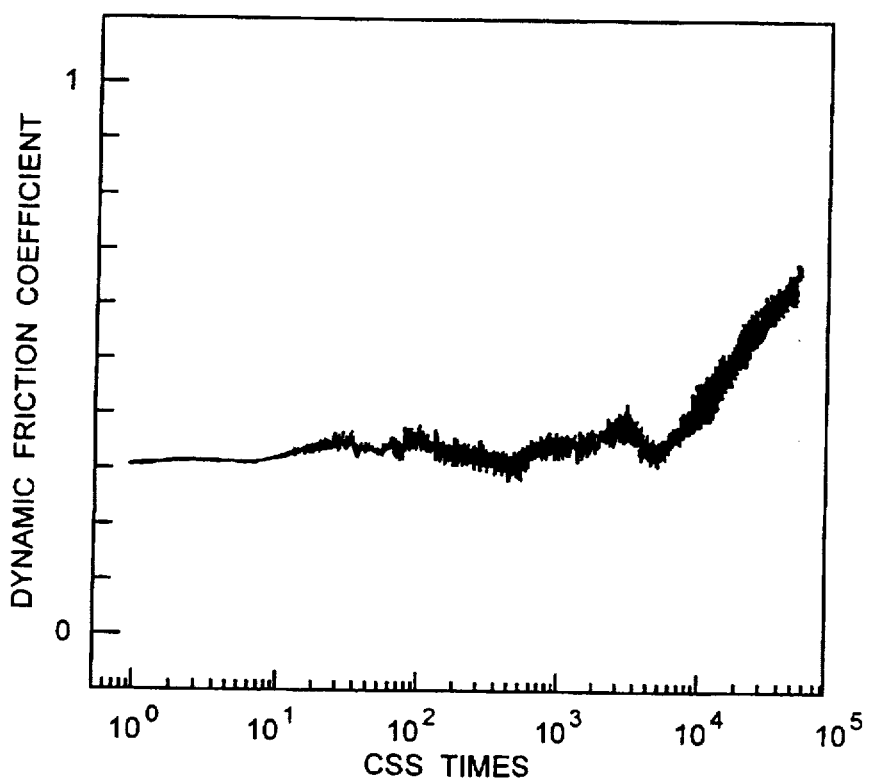
FIG. 4 is a view showing results of measurement of the maximum friction coefficient plotted against the number of times of CSS test in Comparative Example 1.

The medium damaging property was measured by carrying out a CSS test, in which the magnetic disk was repeatedly started and stopped, and measuring the maximum friction coefficient during the rotation of the disk. Where a magnetic head running surface is prone to high medium damage, as the number of the CSS tests increases, the medium surface is damaged and the disk surface of a predetermined surface roughness is smoothed thereby increasing the friction coefficient. FIG. 3 shows the friction coefficient plotted against the number of times of the CSS test in Example 3, and FIG. 4 shows the same in Comparative Example 1. It will be seen that while according to the invention the friction coefficient of the polycrystalline silicon film undergoes almost no changes up to 50,000 times of the CSS test, with the prior art running surface protective film with Si of 5 nm and carbon of 5 nm, the friction coefficient turns to increase gradually from about 10,000 times of the CSS test. The medium damaging property was judged as to whether or not it is good from the friction coefficient after 50,000 times of the CSS test and also from whether it is possible to confirm medium damage with an optical microscope. TABLE 3 shows the results of measurement. As is obvious from TABLE 3, the polycrystalline silicon film according to the invention is superior to the prior art running surface protective film in view of the medium damaging property.

TABLE 3

| | Maximum Friction Coefficient | Damage to Medium |
|---|---|---|
| Examples | | |
| 1 | 0.26 | None |
| 2 | 0.25 | None |
| 3 | 0.29 | None |
| 4 | 0.32 | Some |
| 5 | 6.28 | None |
| 6 | 0.35 | None |
| 7 | 0.23 | None |
| 8 | 0.31 | None |
| 9 | 0.25 | None |
| 10 | 0.23 | None |
| 11 | 0.29 | Some |
| 12 | 0.27 | Some |
| 13 | 0.24 | None |
| 14 | 0.22 | None |
| 15 | 0.27 | None |
| 16 | 0.35 | Some |
| Comparative Examples | | |
| 1 | 0.58 | None |
| 2 | 0.62 | Some |
| 3 | 0.73 | Large |
| 4 | 0.89 | Large |
| 5 | 0.86 | Large |
| 6 | 0.72 | Large |

Figure 5:
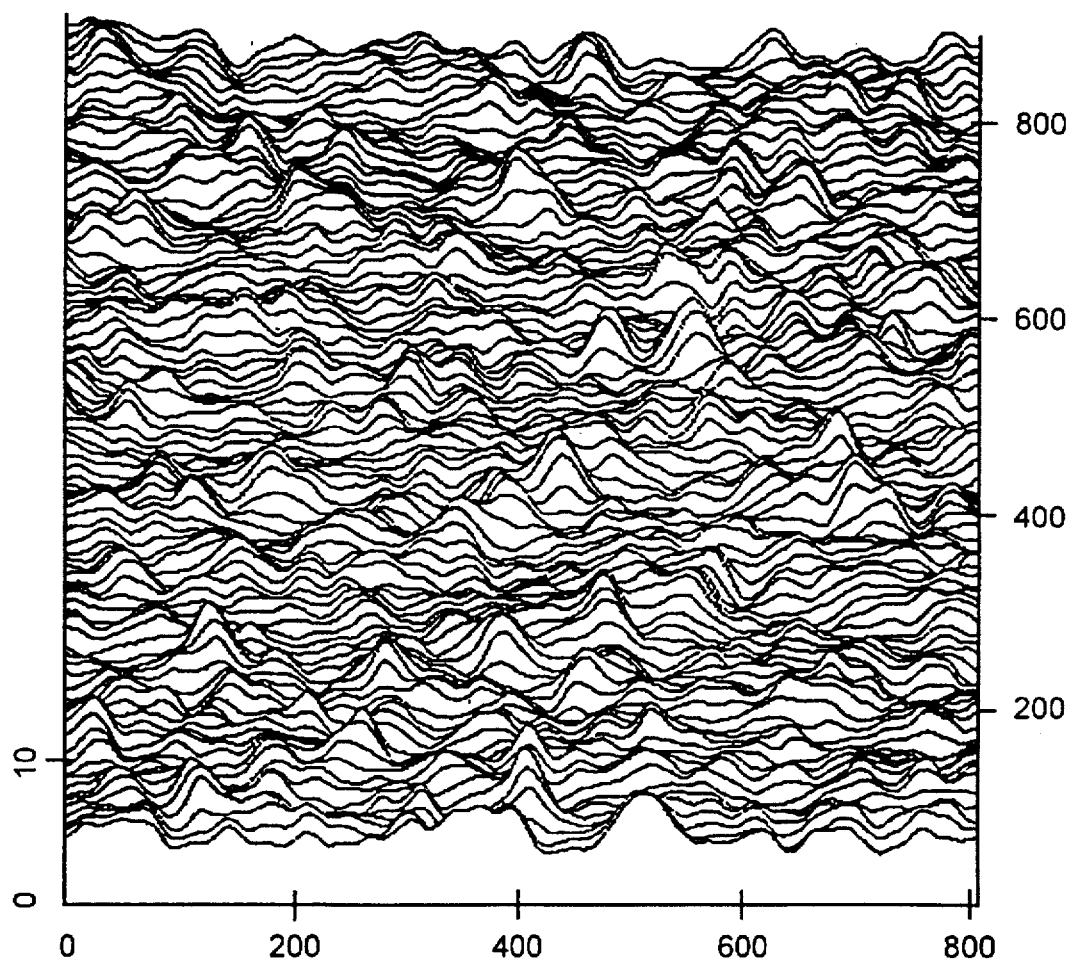
FIG. 5 is a microscopic picture of inter-atomic forces on the slider running surface (i.e., polycrystalline silicon surface) in Example 1.
Figure 6:
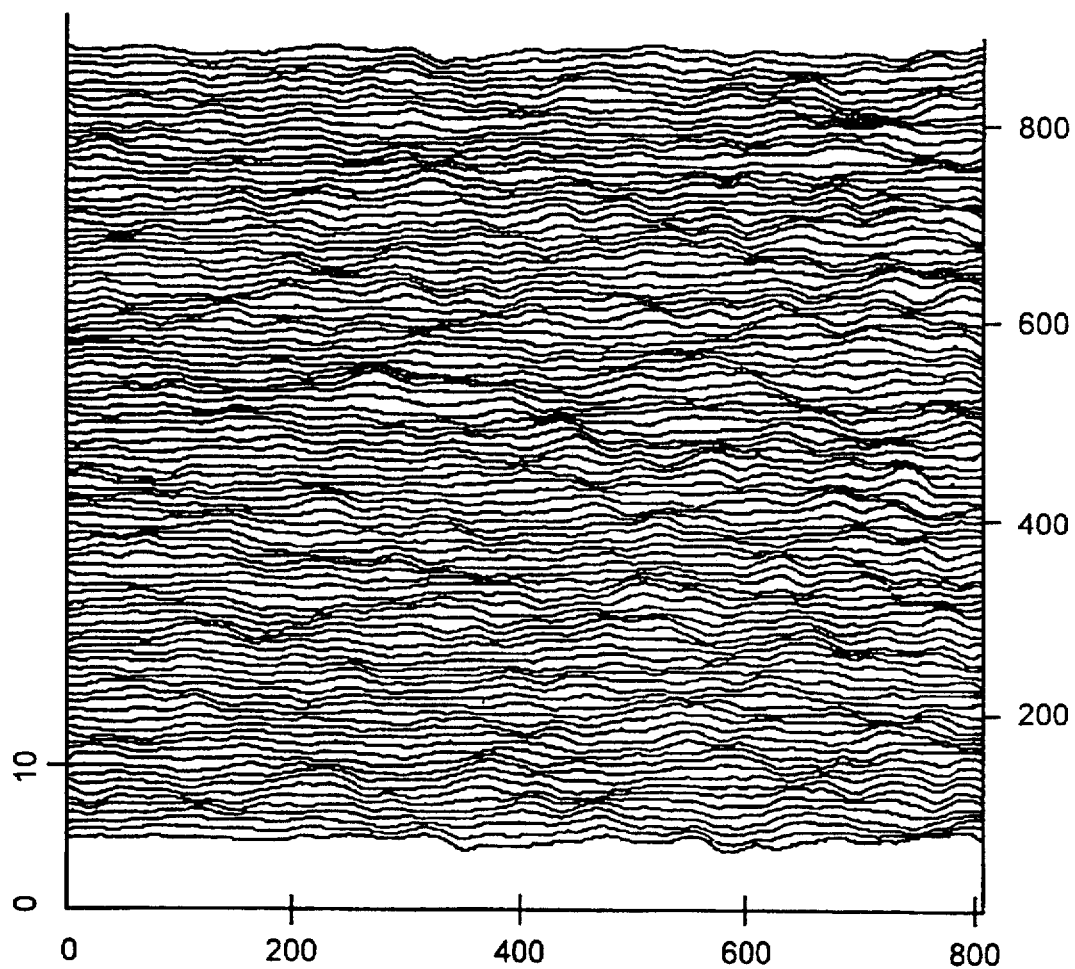
FIG. 6 is a microscopic of atomic forces of the slider running surface (i.e., sputtered carbon surface) of Comparative Example 1.

The surface property of the crystallized silicon film will now be described. FIG. 5 is a microscopic picture of inter-atomic forces on the slider running surface (i.e., polycrystalline silicon surface) in Example 1, and FIG. 6 is a microscopic picture of inter-atomic forces on the running surface in Comparative Example 1. It will be seen that surface roughness stemming from the polycrystalline silicon film is formed. In Example 1, the maximum surface roughness is 6 nm, and in Comparative Example 1 it is 1 nm. The difference of the surface roughness is thought to have reflected on the differences of the various properties described above.

The two-rail type floating magnetic heads in the above examples of the invention, used with hard disk drive, are by no means limitative, and the invention is applicable to three-rail type magnetic heads and also to magnetic heads for floppy magnetic disks and magnetic tapes as well.

With the polycrystalline silicon film, the magnetic head according to the invention has excellent properties in view of 1) adhesivity, 2) chemical stability in high temperature, high relative humidity and like stringent environments, 3) adequate hardness satisfying both the wear resistance of the polycrystalline silicon itself and the medium damage prevention property, 4) fine surface undulations stemming from the crystallinity and undulation control property, and 5) attraction and wetting properties with respect to lubricant molecules. Thus, compared to the prior art magnetic heads, the magnetic head according to the invention has excellent effects in view of the prevention of head-medium attraction, reduction of the friction coefficient and medium damage prevention property. The magnetic disk having such excellent properties permits, when mounted in a magnetic disk drive, high density recording as well as guaranteeing mechanical durability, reliability and long life time.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A magnetic head having a slider, said slider comprising:
   a magnetic transducer carried by said slider for recording, reproducing, and erasing information recorded on a magnetic recording medium;
   running surface on said slider at which a contact-sliding is made with respect to said magnetic recording medium; and
   a polycrystalline silicon film which is provided on said running surface of said slider whereby improved wear resistance and chemical stability with increased frictional efficiency at low speed is accomplished.

2. The magnetic head according to claim 1, in which said polycrystalline silicon film has a thickness of 3 to 10 nm.

3. The magnetic head according to claim 1, in which said running surface is $Al_2O_3.TiC$ ceramic.

4. The magnetic head according to claim 1, in which said running surface is silicon.

5. The magnetic head according to claim 1, in which said polycrystalline silicon film is a CVD film.

6. The magnetic head according to claim 1, in which said polycrystalline silicon film is an eximer laser irradiated film.

* * * * *